United States Patent [19]
Humpherys

[11] Patent Number: 5,668,510
[45] Date of Patent: Sep. 16, 1997

[54] FOUR WAY RF POWER SPLITTER/COMBINER

[75] Inventor: Melvin D. Humpherys, Spokane, Wash.

[73] Assignee: Hewlett-Packard Company, Palo Alto, Calif.

[21] Appl. No.: 688,978

[22] Filed: Jul. 31, 1996

[51] Int. Cl.$^6$ .................................................. H01P 5/12
[52] U.S. Cl. ................................. 333/127; 333/131
[58] Field of Search ................................. 333/124, 127, 333/128, 131, 136

[56] References Cited

U.S. PATENT DOCUMENTS 5,006,822  4/1991  Reddy ........................... 333/131 X
5,237,295  8/1993  Reddick et al. ..................... 333/131

*Primary Examiner*—Paul Gensler
*Attorney, Agent, or Firm*—Edward L. Miller

[57] ABSTRACT

A wide band (20 MHz to 2 GHz) four way RF power splitter/combiner is fabricated from four lengths of hard line mounted on a printed circuit board. Slots in the board allow for ferrite sleeves, and allow the hard line to be mounted right next to the surface(s) of the board. The pieces of hard line do not cross each other, and do not pass from one side of the board to the other. Two of the pieces are on one side of the board, while the other two are on the other. Within one pair the two pieces of hard line lie essentially along a straight line. Within the other pair the two pieces are offset, parallel and overlap slightly. All four pieces are parallel. Of the four pieces, one pair may be preformed to be two identical parts; the other pair may be also, although one pair may have a longer portion of center conductor extending beyond a 90° bend. All four pieces of hard line are straight (i.e., their outer shields are straight, and are not bent).

1 Claim, 5 Drawing Sheets

(SCHEMATIC ONLY)

FOUR WAY RF POWER SPLITTER/COMBINER

BACKGROUND OF THE INVENTION

An RF power splitter/combiner is a passive circuit that has a major port and two or more minor ports interconnected such that RF power applied to the major port is apportioned into (usually equal) amounts that are then available at the minor ports (assuming that they are properly terminated). Conversely, power applied to the minor ports is summed and made available as a combined amount at the major port.

Some devices of this class are fabricated of resistors, connectors and a housing. They resemble minimum loss pads and afford excellent flatness over wide bandwidths (DC to 18, 26.5 or 50 GHz). Resistor types offer excellent SWR and minimal disturbance (change in the ratio) to remaining ports when the impedance terminating one port is not ideal. Unfortunately, they also dissipate power internally, and more than one of these expensive laboratory devices has turned into smoke when someone innocently attached a 50 Ω splitter rated at +27 dbm max onto the antenna of a five watt transceiver and then keyed the mike.

More rugged are the reactive or "transformer" type, often made of sections of coaxial transmission lines that are cleverly interconnected to variously place the sections in series and parallel. They are not as flat, have definite limits on bandwidth, and have division ratios that are sensitive to mismatch. However, they are often considerably less expensive, and since they do not have resistors in series with the path of the power, do not go up in smoke as readily as that other kind. Properly terminated, they can also have excellent isolation between the minor ports. This makes the reactive or transformer type of splitter well suited for use in a wide variety of commercial settings, including some laboratory ones where isolation is prized over issues of extreme bandwidth and flatness.

The ANZAC DS-409-4 is one such reactive or transformer type of power splitter. It has one major port and four minor ports, and is usable from 10 MHz to 2000 MHz at levels up to five watts. Internally, the ANZAC DS-409-4 has four short (approx. 1.25") pieces of hard line (tiny semi rigid coax, 0.047" outside diameter), two of which carry ferrite sleeves over their outer shields.

Unfortunately, it is not of simple construction. Of the four pieces of hard line, two are angled into a common point at an enclosed angle of about 100°. Each does a 180° U turn at its other end. The other two pieces are shaped as broad and shallow U's or arches, and cross over each other at one end where they otherwise meet at about 100°, as for the other pair. None of the four pieces of hard line is straight. (That is, has an unbent outer shield; it is not here an issue for a center conductor extending slightly beyond the end of the shield to bend 90° to reach its destination.) The unit includes a printed circuit board having two rectangular slots; these allow the two pieces of hard line having the ferrites to originate on one side of the board, pass through the slots, and terminate on the other side of the printed circuit board. This gives rise to two additional right angle bends to enter the board perpendicularly, just after the U turns. All in all, assembly of such a splitter is not an easy task, and probably no two of them are quite alike, since instead of simply placing preformed parts in place and soldering them, each piece of hard line appears to have been individually "wrestled" into place. It further appears from a cross coupling in the schematic that, given the 100° angle, some of the pieces of hard line must either cross each other, or pass from one side of the board to the other. In the ANZAC part they do both. (Amendatory note: Since this Application was filed it came to light that the business interests of ANZAC, formerly of Buffington, Mass., have been acquired by MA/COM, with a manufacturing site presently located in Amesbury, Mass.)

It would be desirable if a four way RF power splitter/combiner could be more easily fabricated.

SUMMARY OF THE INVENTION

A wide band (20 MHz to 2 GHz) four way RF power splitter/combiner is fabricated from four lengths of hard line mounted on a printed circuit board. Slots in the board allow for ferrite sleeves, and allow the hard line to be mounted right next to the surface(s) of the board. The pieces of hard line do not cross each other, and do not pass from one side of the board to the other. Two of the pieces are on one side of the board, while the other two are on the other. Within one pair the two pieces of hard line lie essentially along a straight line. Within the other pair the two pieces are offset, parallel and overlap slightly. All four pieces are parallel. Of the four pieces, one pair may be preformed to be two identical parts; the other pair may be also, although one pair may have a longer portion of center conductor extending beyond a 90° bend. All four pieces of hard line are straight (i.e., their outer shields are straight, and are not bent).

DESCRIPTION OF A PREFERRED EMBODIMENT

Figure 1:
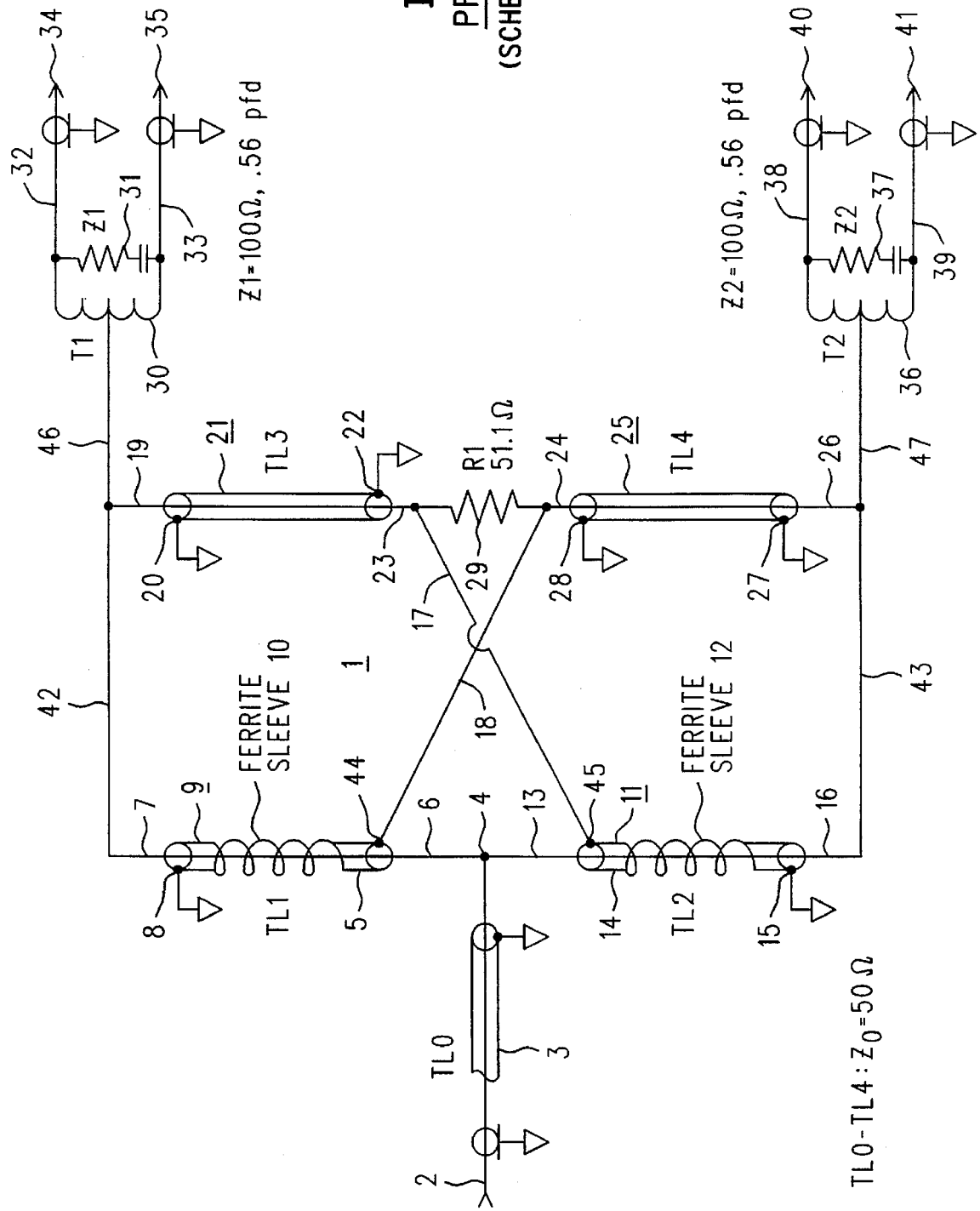
FIG. 1 is a schematic of a four way RF power splitter/combiner that is conventional as to its schematic, but that may be fabricated in a novel way in accordance with the invention.

Refer now to FIG. 1, wherein is shown an electrical schematic 1 of a four way power splitter/combiner. It is quite similar to the ANZAC DS-409-4. The electrical arrangement of the parts is conventional, and as such, its manner of operation is well known and need not be described here. Our interest in FIG. 1 is to identify the parts so that they may be more easily recognized and a novel physical arrangement thereof appreciated.

What we have called the major port corresponds to locations 2 or 4. In the case where the major port is located any significant distance from the rest of the unit, then it is connected to location 4 by a length of transmission line TL0 3, which may be, for example, coax or micro-strip line. It will be recalled that the major port is where power to be divided is applied, or where summed power is made available.

The minor ports are 34, 35, 40 and 41. These may also be carried to separate locations via respective transmission lines 32, 33, 38 and 39.

The splitter/combiner proper begins with transmission lines TL1 9 and TL2 11. In a preferred embodiment these are lengths of hard line, or semi rigid coaxial cable, approximately 0.047" in outer diameter. The center conductor 6 of TL1 9 and the center conductor 13 of TL2 11 are connected together at 4, and are fed from/to point 2 via TL0 3 (if it is there).

The outer shield 5 of TL1 9 has a ferrite sleeve 10 placed thereover; this is denoted by the central portion of the outer shield 5 being represented as a helix (schematic symbol for an inductance). Only one end of the outer shield 5 is grounded; that is done at the far end by connection 8. TL2 11 is similar, having an outer shield 14 bearing ferrite sleeve 12 and being grounded only at its far end by connection 15.

In the preferred embodiment TL1 9 and TL2 11 are mounted on the same side of a printed circuit board, and their center conductors 6/7 and 13/16 are parallel. That is, they lie along, or lie very nearly along, a straight line. It will be appreciated that the interconnection (4) between center conductors 6 and 13 needs to kept as short as possible.

Center conductor 7 of TL1 9 is connected to center conductor 19 of another transmission line TL3 21 by a short interconnection 42. The same may be said of short interconnection 43 for center conductors 16 of TL2 11 and 26 of TL4 25. TL3 21 has its outer shield grounded at the two distal locations 20 and 22. TL4 25 has its outer shield grounded at the two distal locations 27 and 28.

Note the resistor R1 29 connected between center conductor 23 of TL3 21 and center conductor 24 of TL4 25. Also note the cross coupling by conductors 18 (between end of outer shield 44 and center conductor 24) and 17 (between end of outer shield 45 and center conductor 23). In the actual physical embodiment conductors 17 and 18 need to be short.

Now consider conductor 46. It connects the center conductor 19 of TL3 21 to the center tap of an auto transformer T1 30. Across the ends of T1 30 is a compensatory impedance Z1 31. In the preferred embodiment Z1 31 is 100 Ω in series with 0.56 pfd. Other values will obtain according to differing natures for the auto transformer and the way things are physically laid out. For example, ANZAC used simply 130 Ω. Conductor 46 should be short. Minor ports 34 and 35 may be connected to the auto transformer T1 30 by lengths of transmission line 32 and 33, respectively. In a preferred embodiment T1 30 is a two turn transformer, with one turn on either side of the center tap, and with the two turns passing through a suitable ferrite core.

Finally, consider conductor 47. It connects the center conductor 26 of TL4 25 to the center tap of an auto transformer T2 36. Across the ends of T2 36 is a compensatory impedance Z2 37. In the preferred embodiment Z2 37 is also 100 Ω in series with 0.56 pfd. Conductor 47 should be short. Minor ports 40 and 41 may be connected to the auto transformer T2 36 by lengths of transmission line 38 and 39, respectively. In a preferred embodiment T2 36 is also a two turn transformer, with one turn on either side of the center tap, and with the two turns passing through a suitable ferrite core.

All transmission lines are of 50 Ω characteristic impedance, and the major and minor ports all match 50 Ω.

Figure 2A:
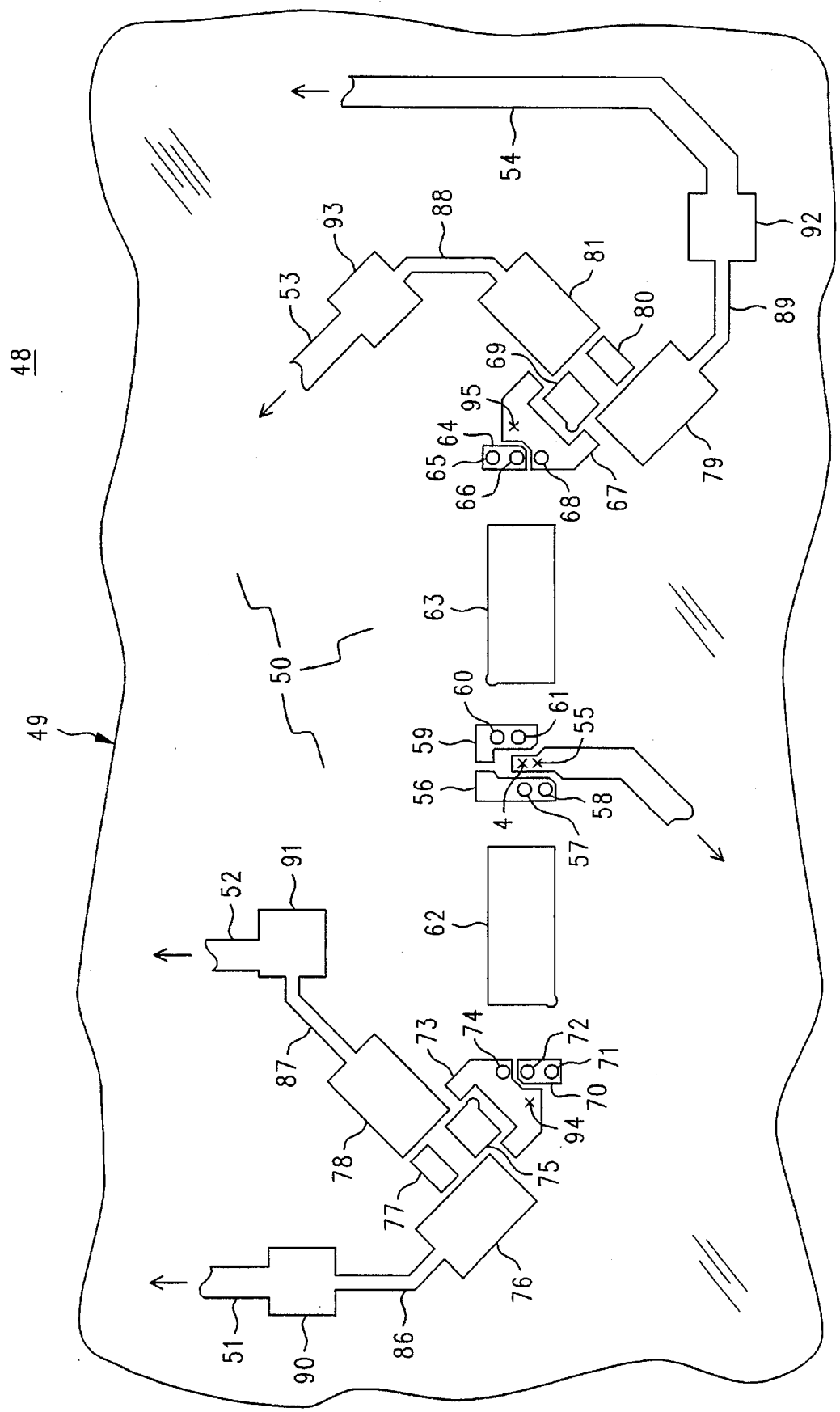
FIG. 2A is a depiction of a trace side of an unloaded printed circuit board that may be used to mount and interconnect the parts shown in the schematic of FIG. 1.

Refer now to FIG. 2A, which is a representation of the trace side 49 (or trace layer) of a (unloaded) printed circuit board 48 which is intended to have mounted thereon the components of FIG. 1. The vast expanse of this trace side 49 is, as represented by 50, simply exposed substrate material (i.e., the copper has been etched away), although covered in most places by a mask of solder resist (not shown). The balance of the items shown are holes (e.g., 57), slots (62), pads (70, 77) and traces (54). Holes can interconnect the trace side with the ground plane side, or layer, of FIG. 2B. All holes are plated through. Slots are larger regions where the substrate has been removed to accommodate the bulk of a component. Unlike holes, slots do not serve to interconnect the sides of the board. Pads are places where the solder mask is absent to allow components to be soldered, as to a trace. Pads may or may not have holes therein. Traces generally go places to interconnect components.

Thus, for example, trace 55 will in due course be understood to correspond to 2/3/4 in FIG. 1, represents the major port, and is what may be termed for later reference, the "prime pad".

Now for a description of what is depicted in the figure. Elements 62 and 63 are slots in the board. They are there to allow clearance for the ferrites 10 and 12 that slip over the outer shields of TL1 9 and TL2 11, respectively. Elements 75 and 69 are also slots; they provide clearance for ease in mounting toroids that are the cores for T1 30 and T2 36, respectively. Traces 51, 52, 53 and 54 are parts of microstrip lines corresponding to 32, 33, 38 and 39, respectively, and are thus associated with the minor ports 34, 35, 40 and 41, respectively. In this connection, it will be appreciated that some additional circuitry is visible here, which is not depicted as part of FIG. 1. Narrow trace regions 86, 87, 88 and 89 are small inductors, while wide trace regions 90, 91, 92 and 93 are capacitors. These inductors and capacitors make up four low pass filters; one at each minor port.

Slot 62 receives TL1 9 with its ferrite sleeve 10. Center conductor 6 is soldered to prime pad 55 at one of the X's (the lower one) and center conductor 7 is soldered to pad 73 at location X 94. Similarly, slot 63 receives TL2 11 and its ferrite sleeve 12. Center conductor 13 is soldered to the other one of the X's at 55 (the upper one), while at the other end of TL2's center conductor 16 is soldered to pad 67 at location X 95.

Although TL3 21 and TL4 25 are mounted to the other side of the board, it is convenient to state here that TL3 21 has its center conductors soldered to holes 74 (19) and 60 (23), while the center conductors of TL4 25 are soldered to holes 68 (26) and 58 (24). Resistor R1 29 is a surface mount part soldered between pads 56 and 59.

Now consider the grounds 8 and 15. Ground 8 occurs by soldering the outer shield of TL1 9 to pad 70. The plated through holes 71 and 72 establish the connection to the ground plane on the other side of the board. Ground 15 occurs by soldering the outer shield of TL2 11 to pad 64; plated through holes 65 and 66 establish the connection to the ground plane.

The cross coupling of conductors 17 and 18 is accomplished by the plated through holes 57 and 58 in pad 56 and by the plated through holes 60 and 61 in pad 59. Pad 73 and hole 74 correspond to conductors 42 and 46, while pad 67 and hole 68 correspond to conductors 43 and 47.

Now consider T1 30. Its ferrite core goes into slot 75. One turn is a short piece of enameled wire that is soldered at one end to pad 73, goes through the core, and then is soldered to pad 78. The other turn is another wire that is soldered to pad 73, goes through the core, and is soldered to pad 76. Pad 77 is an intermediate connection that flows the series combination of a resistor and capacitor (Z1 31) to be connected from pad 76 to pad 78.

Now consider T2 36. Its ferrite core goes into slot 69. One mm is a short piece of enameled wire that is soldered at one end to pad 67, goes through the core, and then is soldered to pad 81. The other turn is another wire that is soldered to pad 67, goes through the core, and is soldered to pad 79. Pad 80 is an intermediate connection that allows the series combination of a resistor and capacitor (Z2 37) to be connected from pad 79 to pad 81.

Figure 2B:
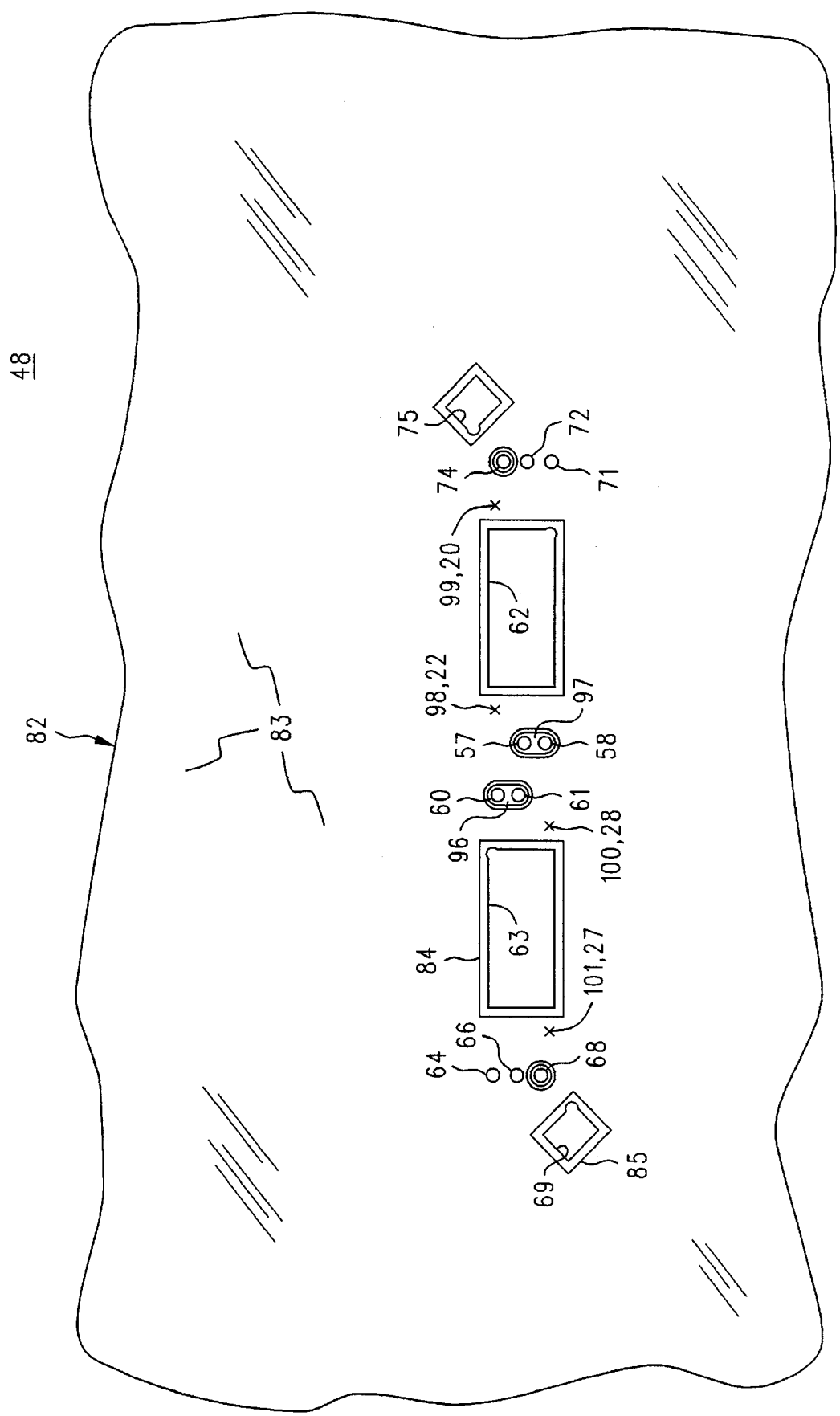
FIG. 2B is a depiction of a ground plane side of the unloaded printed circuit board of FIG. 2A.

Refer now to FIG. 2B, which is a depiction of the unloaded ground plane side 82 (or layer) of the printed circuit board 48 of FIG. 2A. The vast expanse 83 of this side of the board is unremoved copper; it forms the ground plane. It will be appreciated that many of the edges such as 84 and 85 are places where the ground plane stops and some other feature of the board is visible beyond. In particular, note that regions 96 and 97 are pads that join holes 60 and 61, and 57 and 58, respectively. We should also point out that TL3 21 and TL4 25 are mounted to this ground plane side 82. In particular, TL3 21 has its center conductor soldered to holes 60 and 74, while TL4 25 has its center conductors soldered to holes 58 and 68. Ground connections 22 and 20 for the outer shield of TL3 21 are made by solder joints to the underlying ground plane at locations X 98 and X 99, respectively. Ground connections 28 and 27 for the outer shield of TL4 25 are made by solder joints to the underlying ground plane at locations X 100 and X 101, respectively.

Figure 3A:
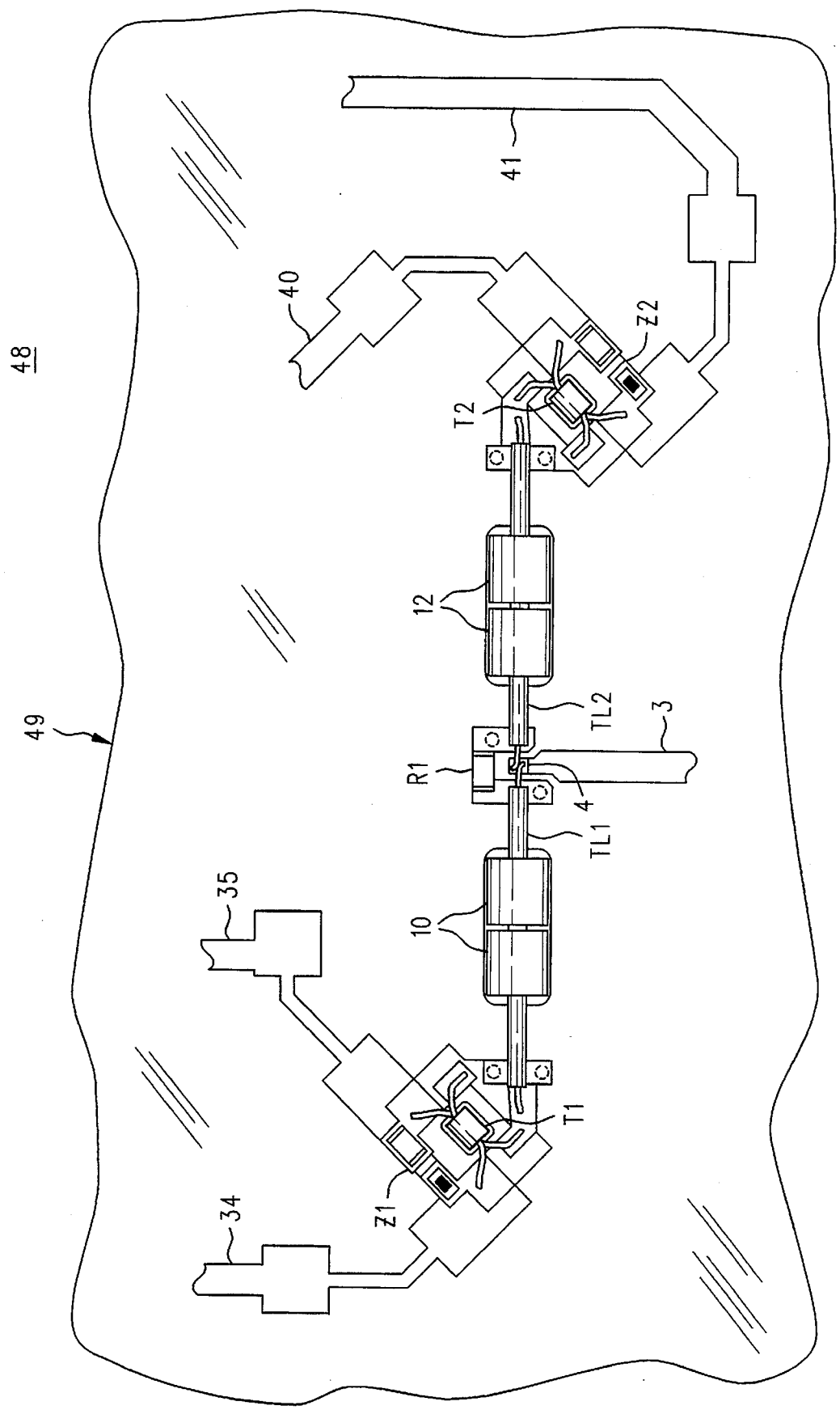
FIG. 3A is a depiction of the trace side of the loaded printed circuit board of FIG. 2A that may be used to mount and interconnect the parts shown in the schematic of FIG. 1.
Figure 3B:
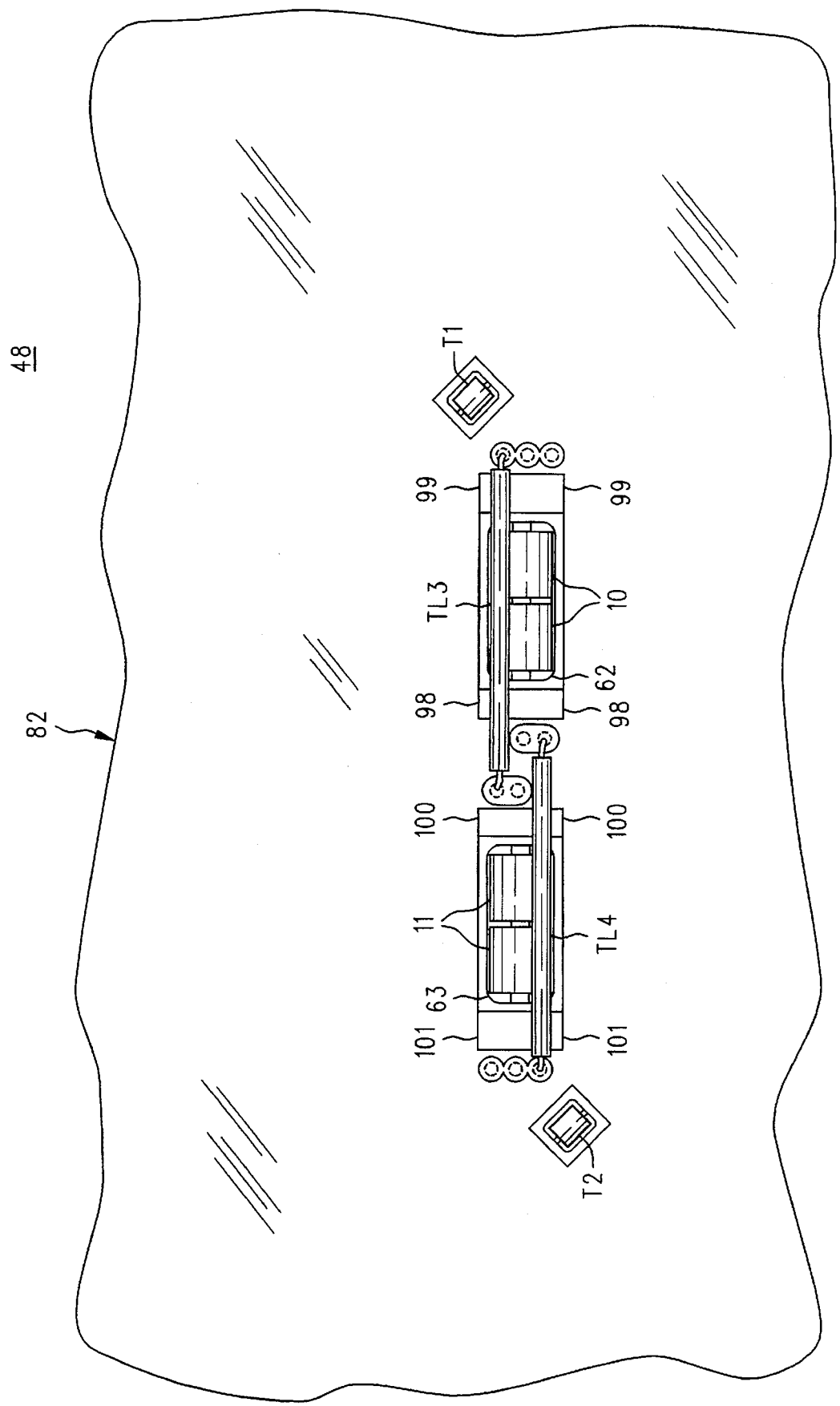
FIG. 3B is a depiction of the ground plane side of the loaded printed circuit board of FIG. 3A.

Refer now to FIG. 3A, which is a depiction of the fully loaded trace side 49 of printed circuit board 48. Note that the ferrite sleeves 10 and 12 may be one or more ferrite toroids. FIG. 3B is a depiction of the fully loaded ground plane side 82 of the printed circuit board 48. Note that regions 98–101 where the outer shields of TL3 and TL4 are soldered to ground are created by absences in a solder mask. These absences are rectangular and abut the narrow ends of the slots 62 and 63. It is believed that, in light of all the foregoing description, these figures are readily understandable, and speak for themselves.

Finally, it will be noted that what has been described is a four way power splitter/combiner of the reactive, or transformer, type, but whose internal lengths of coaxial transmission line are all straight (i.e., the outer shields are not bent), do not pass from one side of the board to the other, and do not cross over one another.

I claim:

1. A four way RF power splitter/combiner comprising:

a printed circuit board having a trace layer that includes individual traces interconnecting at interconnect pads the leads of components and having a ground plane layer that includes substantial expanses of an unremoved conductive foil, there being a prime pad on the trace layer at which a first incident power is split into two intermediate powers, each of which is subsequently split to produce a total of four delivered powers, and at which prime pad second through fifth incident powers are combined into a unitary delivered power;

a first slot in the printed circuit board, the first slot being generally centered about a longest first axis and having a first width;

a second slot in the printed circuit board, the second slot being generally centered about a longest second axis and having a second width;

the first and second axes being generally parallel;

the first and second slots being on opposite sides of the prime pad and disposed such that the width of each is substantially within the projection of the other, the first and second widths being wider than the respective outside diameters of the first and second inductors recited below;

a first interconnect pad on the trace layer, having two holes therethrough that on the ground plane layer are electrically separated from the ground plane, the first interconnect pad being disposed between the prime pad and a narrow end of the first slot closest to the prime pad;

a second interconnect pad on the trace layer, having two holes therethrough that on the ground plane layer are electrically separated from the ground plane, the second interconnect pad being disposed between the prime pad and a narrow end of the second slot closest to the prime pad;

a third interconnect pad on the trace layer, having two holes therethrough that electrically connect to the ground plane, the third interconnect pad being disposed proximate a narrow end of the first slot farthest from the prime pad;

a fourth interconnect pad on the trace layer, having two holes therethrough that electrically connect to the ground plane, the fourth interconnect pad being disposed proximate a narrow end of the second slot farthest from the prime pad;

a fifth interconnect pad on the trace layer, having a hole therethrough that on the ground plane layer is electrically separated from the ground plane, the fifth interconnect pad being disposed proximate the third interconnect pad;

a sixth interconnect pad on the trace layer, having a hole therethrough that on the ground plane layer is electrically separated from the ground plane, the sixth interconnect pad being disposed proximate the fourth interconnect pad;

a first coaxial transmission line having an inner conductor and an outer shield, the outer shield being of a straight and unbent length that spans the distance between the first and third interconnect pads, and the inner conductor being of a length that spans the distance from the prime pad to the fifth pad;

a first inductor including at least one ferrite toroid disposed around the outer shield of the first coaxial transmission line;

a second coaxial transmission line having an inner conductor and an outer shield, the outer shield being of a straight and unbent length that spans the distance between the second and fourth interconnect pads, and the inner conductor being of a length that spans the distance from the prime pad to the sixth pad;

a second inductor including at least one ferrite toroid disposed around the outer shield of the second coaxial transmission line;

the first coaxial transmission line and the first inductor being mounted to the trace layer by soldering one end of the center conductor of the first coaxial transmission line to the prime pad and the other end to the fifth interconnect pad, and by soldering one end of the outer shield of the first transmission line to the first interconnect pad and the other end to the third interconnect pad;

the second coaxial transmission line and the second inductor being mounted to the trace layer by soldering one end of the center conductor of the second coaxial transmission line to the prime pad and the other end to the sixth interconnect pad, and by soldering one end of the outer shield of the second transmission line to the second interconnect pad and the other end to the fourth interconnect pad;

a portion of the first inductor occupying the first slot and a portion of the second inductor occupying the second slot;

a first resistor mounted to the trace layer by soldering one end thereof to the first interconnect pad and the other end thereof to the second interconnect pad, the ohmic value of the first resistor being approximately the same as the characteristic impedance of the first and second coaxial transmissions lines;

a third coaxial transmission line having an inner conductor and an outer shield, the inner conductor being of a length that spans the distance between the hole in the fifth interconnect pad and an associated one of the holes in the second interconnect pad, and the outer shield of the third coaxial transmission line being straight and unbent;

the third coaxial transmission line being mounted to the ground plane side by soldering one end of the center conductor thereof to the hole in the fifth interconnect pad and the other end of the center conductor to its associated hole in the second interconnect pad, and by soldering each end of the outer shield of the third coaxial transmission line to the ground plane proximate the respective narrow ends of the first slot;

a fourth coaxial transmission line having an inner conductor and an outer shield, the inner conductor being of a length that spans the distance between the hole in the sixth interconnect pad and an associated one of the holes in the first interconnect pad, and the outer shield of the fourth coaxial transmission line being straight and unbent;

the fourth coaxial transmission line being mounted to the ground plane side by soldering one end of the center conductor thereof to the hole in the sixth interconnect pad and the other end of the center conductor to its associated hole in the first interconnect pad, and by soldering each end of the outer shield of the fourth coaxial transmission line to the ground plane proximate the respective narrow ends of the second slot;

the first, second, third and fourth coaxial transmission lines being generally parallel to one another;

seventh and eighth interconnect pads proximate the fifth interconnect pad;

a first center-tapped auto transformer, the center tap thereof being electrically connected to the fifth interconnect pad, one of the two extreme ends of the auto transformer's winding being electrically connected to the seventh interconnect pad and the other to the eighth interconnect pad;

ninth and tenth interconnect pads proximate the sixth interconnect pad;

a second center-tapped auto transformer, the center tap thereof being electrically connected to the sixth interconnect pad, one of the two extreme ends of the auto transformer's winding being electrically connected to the ninth interconnect pad and the other to the tenth interconnect pad;

a first compensatory impedance soldered between the seventh and eighth interconnect pads;

a second compensatory impedance soldered between the ninth and tenth interconnect pads; and the seventh, eighth, ninth and tenth interconnect pads being the electrical sources of the four delivered powers and the electrical receptacles of the second through fifth incident powers.

* * * * *

UNITED STATES PATENT AND TRADEMARK OFFICE
CERTIFICATE OF CORRECTION

PATENT NO. : 5,668,510
DATED : 9/16/97
INVENTOR(S) : Melvin D. Humpherys

It is certified that error appears in the above-indentified patent and that said Letters Patent is hereby corrected as shown below:

Column 3, line 13, "*ire*" should read --*are*--; and line 16, "*He*" should read --*lie*--.

Column 4, line 64, "*mm*" should read --*turn*--.

Signed and Sealed this

Twenty-eighth Day of September, 1999

Attest:

Q. TODD DICKINSON

*Attesting Officer*    *Acting Commissioner of Patents and Trademarks*